US007079299B1

(12) United States Patent
Conant et al.

(10) Patent No.: US 7,079,299 B1
(45) Date of Patent: Jul. 18, 2006

(54) STAGGERED TORSIONAL ELECTROSTATIC COMBDRIVE AND METHOD OF FORMING SAME

(75) Inventors: Robert A. Conant, Berkeley, CA (US); Jocelyn T. Nee, Albany, CA (US); Kam-Yin Lau, Danville, CA (US); Richard S. Muller, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/584,835

(22) Filed: May 31, 2000

(51) Int. Cl.
   *G02B 26/08* (2006.01)

(52) U.S. Cl. ........................................ 359/224; 310/309
(58) Field of Classification Search ................ 359/198, 359/212, 213, 214, 223, 224, 872, 877, 883; 310/309; 73/514.16, 514.29, 504.12
See application file for complete search history.

(56) References Cited

U.S. PATENT DOCUMENTS

| 5,428,259 A | * | 6/1995 | Suzuki | 310/309 |
| 5,959,760 A | | 9/1999 | Yamada et al. | 359/224 |
| 5,995,334 A | * | 11/1999 | Fan et al. | 360/294.3 |
| 6,133,670 A | * | 10/2000 | Rodgers et al. | 310/309 |
| 6,201,629 B1 | | 3/2001 | McClelland et al. | 359/223 |
| 6,308,573 B1 | * | 10/2001 | Lee et al. | 73/652 |
| 6,628,041 B1 | * | 9/2003 | Lee et al. | 310/309 |

FOREIGN PATENT DOCUMENTS

US    PCT/US01/15514    5/2001

OTHER PUBLICATIONS

Yao and MacDonald, "Single Crystal Silicon Supported Thin Film Micromirrors for Optical Applications", *Opt. Eng.*, 36(5):1408–1413 (May 1997).

Yeh et al., "Integrated Polysilicon and DRIE Bulk Silicon Micromachining for an Electrostatic Torsional Actuator", *J. Microelectromechanical Systems*, 8(4):456–465 (Dec. 1999).

Kam Y. Lau, "Microscanner Raster–scanning Display: A Spyglass for the Future", Optics & Photonic News, May 1999 vol.. 10 No. 5, pp. 47–50, 84.

Nee et al. "Stretched–Film Micromirrors For Improved Optical Flatness", IEEE MEMS 2000 Conference, Jan. 23–27, 2000, Miyazaki Japan.

(Continued)

*Primary Examiner*—Mark A. Robinson
(74) *Attorney, Agent, or Firm*—Fish & Richardson P.C.

(57) ABSTRACT

A staggered torsional electrostatic combdrive includes a stationary combteeth assembly and a moving combteeth assembly with a mirror and a torsional hinge. The moving combteeth assembly is positioned entirely above the stationary combteeth assembly by a predetermined vertical displacement during a combdrive state. A method of fabricating the staggered torsional electrostatic combdrive includes the step of deep trench etching a stationary combteeth assembly in a first wafer. A second wafer is bonded to the first wafer to form a sandwich including the first wafer, an oxide layer, and the second wafer. A moving combteeth assembly is formed in the second wafer. The moving combteeth assembly includes a mirror and a torsional hinge. The moving combteeth assembly is separated from the first wafer by the oxide layer. The oxide layer is subsequently removed to release the staggered torsional electrostatic combdrive.

39 Claims, 6 Drawing Sheets

OTHER PUBLICATIONS

Conant et al. "Robustness and Reliability of Micromachined Scanning Mirrors", MOEMS 1999, Mainz Germany, Aug. 1999.

Hagelin et al. "Integrated Micromachined Scanning Display Systems", presented at $18^{th}$ Congress of the International Commission for Optics, San Francisco, CA, Aug. 1999.

Conant et al. "A Raster–Scanning Full–Motion Video Display Using Polysilicon Micromachined Mirrors", proc. Transducers '99, Sendai, Japan, Jun. 1999, pp. 376–379.

Hart et al."Time–Resolved Measurement of Optical Mems Using Stroboscopic Interferometry", proc. Transducers '99, Sendai, Japan, Jun. 1999, pp. 470–473.

Yeh et al. "Mechanical Digital–To–Analog Converters", proc. Transducers '99, Sendai, Japan, Jun. 1999, pp. 998–1001.

Nee et al. "Scanning Blazed–Grating for High–Resolution Spectroscopy", 1998 Workshop for Solid State Sensors and Actuators (HH '98) Late News Poster Session Supplemental Digest, Hilton Head Island, Jun. 8–11, 1998, pp. 9–10.

Kiang et al. "Surface–Micromachined Diffraction Gratings for Scanning Spectroscopic Application", proc. Transducers '99, Sendai, Japan, Jun. 1999, pp. 998–1001.

Nee et al. "Lightweight, Optically Flat Micromirrors for Fast Beam Steering", IEEE/LEOS Optical MEMS 2000, Kauai, Hawaii, Aug. 21–24, 2000.

Conant et al. "A Flat High–Frequency Scanning Micromirror", 2000 Workshop for Solid State Sensors and Actuators (HH2000), Hilton Head Island, SC, USA, Jun. 4–8, 2000, pp. 6–9, Digest of Technical Papers.

Conant et al. "Cyclic Fatigue Testing of Surface–Micromachined Thermal Actuators", 1998 ASME International Mechanical Engineering Congress and Exposition, Nov. 15–20, 1998, Anaheim, CA DSC–vol. 66, pp. 273–277.

Yoon et al. "Use of High–Field Electrical Testing for SIMOX BOX Metrology", in Proceedings of 1995 IEEE International SOI Conference, Tucson, AZ, USA, Oct. 3–5, 1995, pp. 146–147.

Yap et al. "A Model for High–Field Conduction In Simox Burried Oxides", in Proceedings of 1994 IEEE International SOI Conference, Nantucket, MA, USA, Oct. 3–6, 1994, pp. 93–94.

Hyodo et al., "An HDR System Hydraulics Model and Detailed Analysis of the 1991 Circulation Test at the Hijiori HDR Site, Japan", Geothermal Resources Council Transactions, vol. 198, Oct. 1995, pp. 263–268.

Hyodo et al., "An HDR System Hydraulics Model and Analysis of the 1995 Preliminary Circulation Test at the Hijiori HDR Site of the NEDO Project, Japan", Twentieth Stanford Workshop on Geothermal Reservoir Engineering, pp. 23–24.

Wright et al., "Hydraulic Fracture Orientation and Production/Injection Induced Reservoir Stress Changes in Diatomite Waterfloods", Society of Petroleum Engineers, pp. 139–151.

Hoon et al, "A Model for SIMOX Buried–Oxide High–Field Conduction", IEEE Transactions on Electron Devices, vol. 43, No. 11, Nov. 1996.

Hart et al., "Stroboscopic phase–shifting interferometry for dynamic characterization of optical MEMS", $18^{th}$ Congress of the International Commission for Optics, ICO XVIII Aug. 2–6, 1999, San Francisco, CA USA, Optics for the Next Millennium, Technical Digest SPIE vol. 3749, pp. 468–469.

Cotton et al., "Wide–angle geocornal telescope: a He–II 304–A plasmaspheric imager", Optical Engineering, Dec. 1993, vol. 32 No. 12, pp. 3170–3173.

Wright et al., "Reorientation of propped refracture treatments", Eurock '97 © 1994 Balkema, Rotterdam, ISBN 90 5410 502 X, pp. 417–424.

Yap et al., "Conduction Mechanisms Through Simox Buried Oxide", in Proceedings of 1993 IEEE International SOI Conference, Palm Springsm, CA, USA, Oct. 5–7, 1993, pp. 32–33.

* cited by examiner

STAGGERED TORSIONAL ELECTROSTATIC COMBDRIVE AND METHOD OF FORMING SAME

This invention was made with Government support under Grant (Contract) No. EEC-9615774, awarded by the National Science Foundation. The Government has certain rights to this invention.

BRIEF DESCRIPTION OF THE INVENTION

This invention relates generally to Micro-Electro Mechanical Systems (MEMS). More particularly, this invention relates to a staggered torsional electrostatic combdrive that may be used to control a micromirror or paddle structure for mounted electronic components.

BACKGROUND OF THE INVENTION

Micro-Electro Mechanical Systems (MEMS), which are sometimes called micromechanical devices or micromachines, are three-dimensional objects having one or more dimensions ranging from microns to millimeters in size. The devices are generally fabricated utilizing semiconductor processing techniques, such as lithographic technologies.

There are on going efforts to develop MEMS with scanning mirrors, referred to as scanning micromirrors. It is a goal to use scanning micromirrors in the place of scanning macro-scale mirrors, which are used in a variety of applications. For example, macro-scale mirrors are used in: barcode readers, laser printers, confocal microscopes, and fiber-optic network components. There are significant limitations to the performance of macro-scale scanners; in particular, their scanning speed, power consumption, cost, and size often preclude their use in portable systems. Scanning micromirrors could overcome these problems. In addition, higher-frequency optical scanning could enable new applications that are not practical with conventional scanning mirrors, such as raster-scanning projection video displays, and would significantly improve the performance of scanning mirrors in existing applications, such as laser printers. MEMS optical scanners promise to enable these new applications, and dramatically reduce the cost of optical systems.

Unfortunately, previously demonstrated MEMS mirrors have not been able to simultaneously meet the requirements of high scan speed and high resolution. A plethora of micromirror designs have been presented, but not one has been able to satisfy the potential of MEMS: a high-speed, high-performance scanning mirror.

In view of the foregoing, it would be highly desirable to provide a high-speed, high-performance scanning micromirror system. Such a system should include improved system components, such as an improved combdrive for implementing scanning operations.

SUMMARY OF THE INVENTION

A staggered torsional electrostatic combdrive includes a stationary combteeth assembly and a moving combteeth assembly with a mirror and a torsional hinge. The moving combteeth assembly is positioned entirely above the stationary combteeth assembly by a predetermined vertical displacement during a combdrive resting state. A method of fabricating the staggered torsional electrostatic combdrive includes the step of deep trench etching a stationary combteeth assembly in a first wafer. A second wafer is bonded to the first wafer to form a sandwich including the first wafer, an oxide layer, and the second wafer. A moving combteeth assembly is formed in the second wafer. The moving combteeth assembly includes a mirror and a torsional hinge. The moving combteeth assembly is separated from the first wafer by the oxide layer. The oxide layer is subsequently removed to release the staggered torsional electrostatic combdrive.

The micromirror of the invention fulfills the potential of micromachined mirrors over conventional scanning mirrors—high scan speed, small size, and low cost with diffraction-limited optical performance. The scan speed of the micromirror is difficult to achieve with large-scale optical scanners, and exceeds the performance of previously demonstrated micromachined scanning mirrors.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
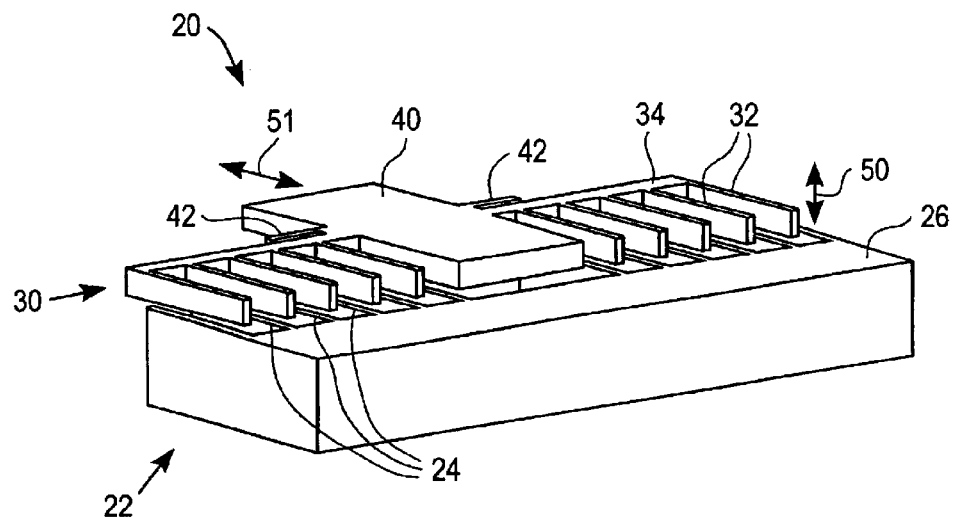
FIG. 1 is a perspective view of a simplified Staggered Torsional Electrostatic Combdrive (STEC) of the invention in a resting position.

FIG. 1 illustrates a Staggered Torsional Electrostatic Combdrive (STEC) 20 in accordance with an embodiment of the invention. The STEC 20 includes a stationary combteeth assembly 22 including individual combteeth 24 formed on a combteeth spine 26. Positioned entirely above the stationary combteeth assembly 22 in a resting state is the moving combteeth assembly 30. The moving combteeth assembly 30 includes individual combteeth 32 linked by a combteeth spine 34. The moving combteeth assembly 30 also includes a mirror or paddle 40 with associated torsional hinges 42.

Those skilled in the art will appreciate that the positioning of the moving combteeth assembly 30 such that it is entirely over the stationary combteeth assembly 22 during fabrication and in a resting state departs from the prior art. In the prior art, stationary and moving combteeth overlap during fabrication and in a resting state. In contrast, with the STEC system 20, the moving combteeth assembly 30 in its as-fabricated position is 0.2 to 3.0 microns above the stationary combteeth assembly 22. This vertical displacement between the stationary and moving combteeth assemblies also exists in the resting state, as shown in FIG. 1. The vertical displacement between the stationary and moving combteeth assemblies of the invention allows for a larger mirror displacement range. Further, this vertical displacement allows for simplified fabrication techniques, as discussed below.

Figure 2:
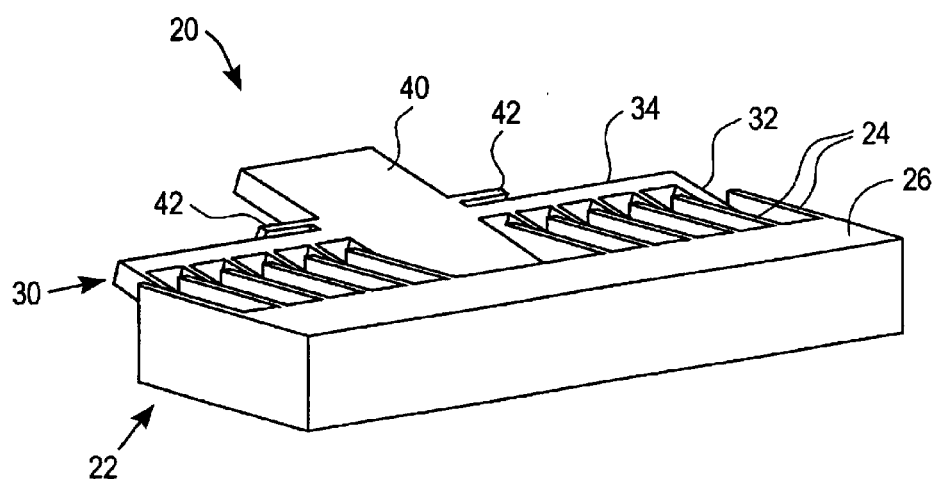
FIG. 2 is a perspective view of the simplified STEC of the invention in an activated position.

FIG. 2 illustrates the STEC system 20 in an activated state. This state is achieved by applying a voltage between the moving combteeth assembly 30 and the stationary combteeth assembly 22. The applied voltage attracts the moving combteeth assembly to the fixed combteeth assembly, thus exerting torque on the torsional hinges 42, forcing the mirror to tilt. The torsional hinges 42, which are anchored, provide restoring torque when the voltage is removed. Observe that the mirror 40 moves directly in response to the movement of the combteeth assembly 30. In other words, the movement of the combteeth assembly 30 is not directed to an intermediate structure, such as a spring, which applies the force to the mirror 40, as is the case in many prior art combdrive designs.

Figure 3:
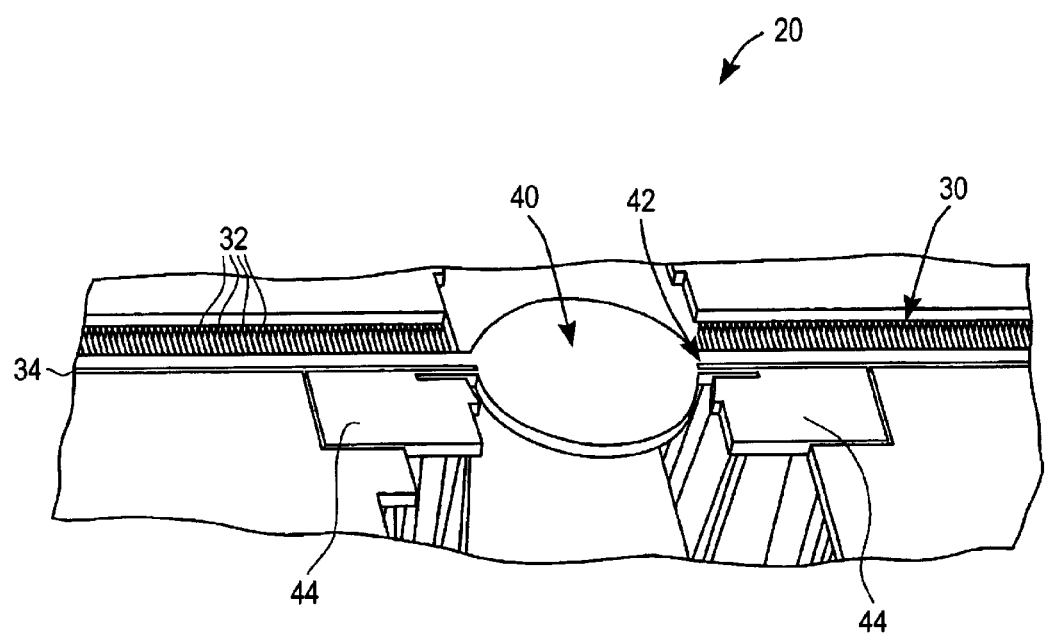
FIG. 3 is a perspective view of a STEC of the invention in a resting position.

FIG. 3 provides a perspective detailed view of the STEC system 20. The figure clearly illustrates the moving combteeth assembly 30. In addition to having individual combteeth 32 and a combteeth spine 34, the moving combteeth assembly 30 has a mirror 40 and torsional hinges 42, which terminate in anchors 44. FIG. 3 illustrates the STEC system 20 in a resting state. In an active state, the moving combteeth assembly 30 turns into the page, causing the far side of the mirror 40 to turn into the page and the near side of the mirror 40 to lift out of the page.

The STEC system 20 may be implemented with a combteeth thickness, as shown with arrow 50 in FIG. 1, of between 10 and 500 microns, preferably approximately between 50 and 100 microns. Similarly, the thickness of the mirror 40 is between 10 and 500 microns, preferably approximately between 50 and 100 microns. Arrow 51 of FIG. 1 illustrates a lateral dimension. The lateral dimension of the mirror 40 is preferably less than 10 millimeters, more preferably between 550 microns and 2000 microns. The gap between individual combteeth is preferably less than 30 microns, preferably approximately between 2 and 10 microns.

The STEC system 20 offers several advantages over other electrostatic-actuator designs. First, the actuator applies torque to the mirror directly—there are no hinges to couple linear motion of an actuator into torsional mirror motion. This greatly simplifies the design of the structure, and makes post-fabrication assembly steps unnecessary.

Second, the actuator starts in an unbalanced state and is capable of static mirror positioning as well as resonant scanning. Previously demonstrated balanced torsional electrostatic actuators have been very promising for resonant operation, but are not capable of static mirror positioning.

Third, the torsional combdrive offers an advantage over gap-closing actuators because the energy density in the combdrive is higher than that in a gap-closing actuator, thereby allowing larger scan angles at high resonant frequencies.

Figure 4:
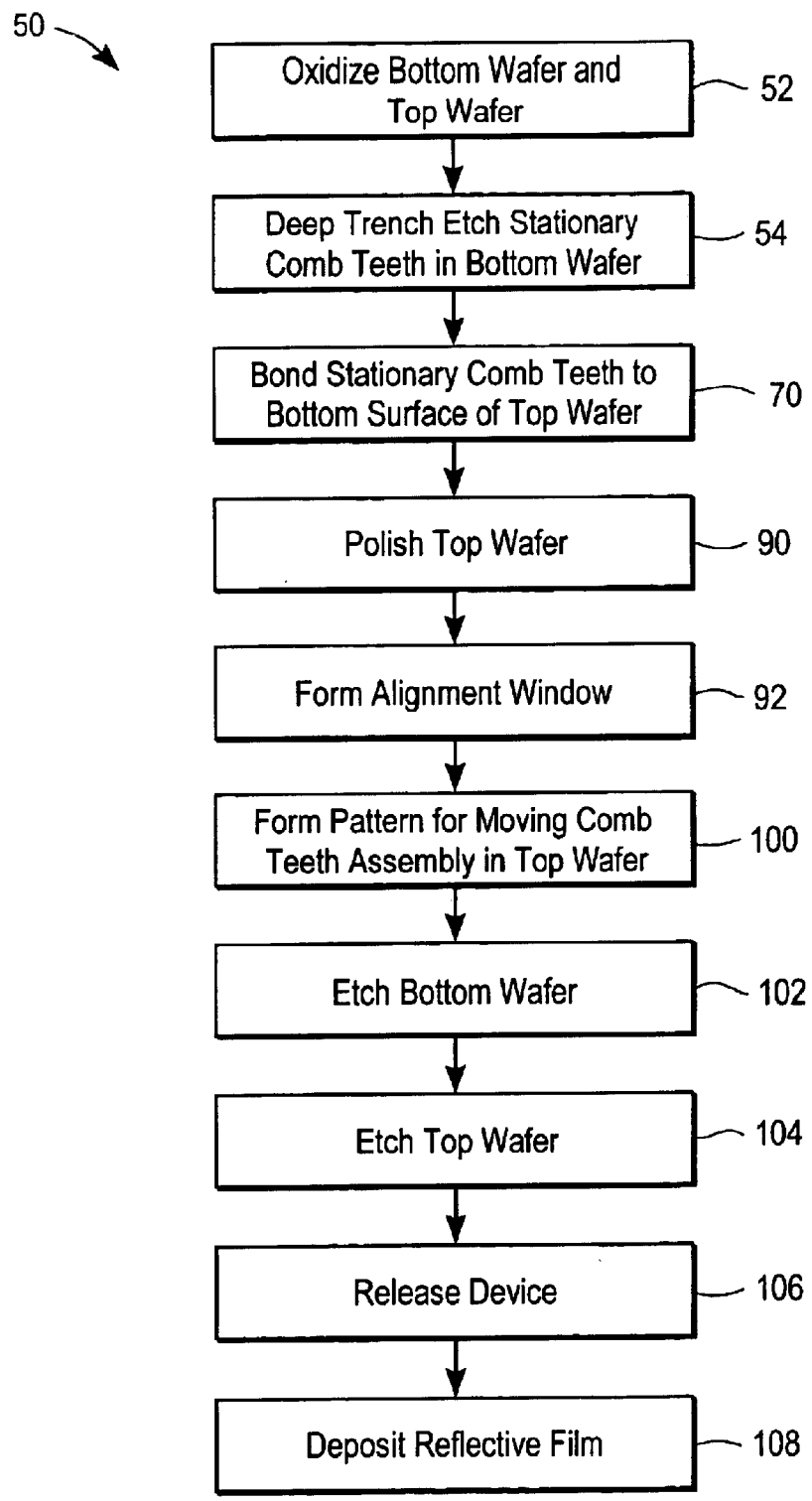
FIG. 4 illustrates processing steps used to construct a STEC of the invention.

The structure and benefits of the STEC system 20 have been described. Attention now turns to fabrication techniques that may be used to construct the device. FIG. 4 illustrates processing steps 50 used in accordance with an embodiment of the invention. The first processing step shown in FIG. 4 is to oxidize a bottom wafer and a top wafer (step 52).

By way of example, the bottom silicon wafer may be oxidized in steam at 1000° C. to grow 0.2 µm of thermal oxide. The top silicon wafer may be oxidized in steam at 1000° C. to grow 1.5 µm of thermal oxide. Advantageously, the top silicon wafer may be formed of single-crystal silicon.

Figure 5A:
FIGS. 5A–5F illustrate the construction of a STEC of the invention in accordance with the processing steps of FIG. 4.

The next processing step in FIG. 4 is to deep trench etch stationary combteeth into the bottom wafer (step 54). In particular, the bottom wafer is patterned and 100 µm-deep trenches are etched into the wafer using an STS deep reactive-ion etcher to form the stationary combteeth assembly. FIG. 5A illustrates the results of this processing step. In particular, FIG. 5A illustrates a bottom wafer 60 with an oxide layer 62. Individual combteeth 24 of the stationary combteeth assembly 22 are shown in FIG. 5A.

Figure 5B:
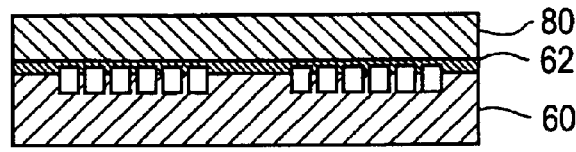

The next processing step shown in FIG. 4 is to bond the stationary combteeth of the bottom wafer to the bottom surface of the top wafer (step 70). Preferably, this bonding process includes a step of cleaning each wafer prior to bonding and of annealing the bonded wafer pair at approximately 1100° C. for approximately one hour to increase the bond strength. The result of this processing is shown in FIG. 5B. In particular, FIG. 5B illustrates a top wafer 80 bonded to the bottom wafer 60 through an oxide layer 62.

Figure 5C:
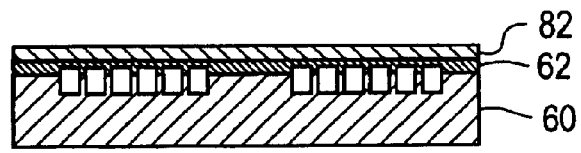

The next processing step of FIG. 4 is to polish the top wafer (step 90). In particular, the top wafer is ground and polished to leave a 50 µm-thick layer of silicon above the oxide interface 62. FIG. 5C illustrates the result of this processing. The figure shows the polished top wafer 82 with a significantly smaller vertical height than the pre-polished top wafer 80 of FIG. 5B. The polishing step 90 preferably includes the step of oxidizing the bonded structure at 1100° C. in a steam ambient to form, for example, a 1.1 µm-thick oxide layer on the top and bottom surfaces of the bonded structure.

The next processing associated with FIG. 4 is to form an alignment window (step 92). The alignment window is used to provide an alignment reference for the subsequent patterns and the buried combteeth. The alignment window is formed by etching a window in the top wafer, with the oxide layer 62 operating as a stop layer.

The next processing step is to form the moving combteeth assembly in the top wafer (step 100). In particular, the front side pattern, which defines the moving combteeth, the mirror, the torsion hinges, and the anchor is then patterned and etched into the top oxide layer. The pattern is subsequently etched into the silicon wafer 82 (as discussed below in connection with step 104). The alignment of this step is critical because misalignment between the moving combteeth and the fixed combteeth can lead to instability me torsional combdrive. By using a wafer stepper, alignment accuracy of better than 0.2 µm between the buried pattern and the frontside pattern may be achieved.

Figure 5D:
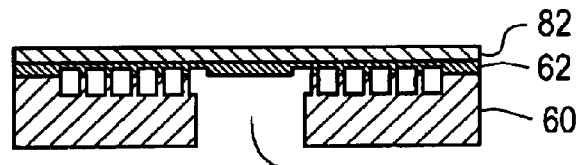

The next processing step in FIG. 4 is to etch the backside hole in the bottom wafer (step 102). In particular, the silicon 60 on the backside of the bottom wafer is patterned with the hole layer, and the backside hole 94 is etched in the bottom wafer to open an optical path underneath the micromirror. FIG. 5D illustrates a backside hole 94 formed in the bottom wafer 60.

Figure 5E:
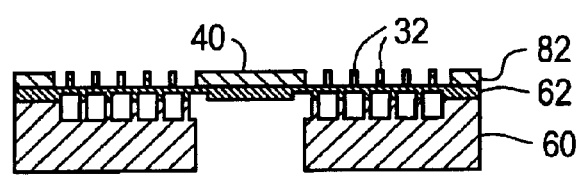

The next processing step in FIG. 4 is to etch the top wafer (step 104). In particular, this step entails etching the top wafer 82 using the previously patterned top oxide layer as an etch mask. This processing results in the structure of FIG. 5E. FIG. 5E illustrates individual combteeth 32 of the moving combteeth assembly 30. The figure also illustrates the mirror 40.

The next processing step shown in FIG. 4 is to release the device (step 106). The structure may be released in a timed HF etch to remove the sacrificial oxide film below the combteeth and mirror. This results in the structure of FIG. 5F.

FIG. 4 illustrates a final optional step of depositing a reflective film (step 108). That is, a 100 nm-thick aluminum film may be evaporated through gap 94 onto the bottom of the mirror to increase the reflectivity for visible light. The structure of the STEC micromirror of the invention allows access to the backside of the mirror surface, thereby allowing for this processing step. Instead of a reflective film, a multi-layered optical filter may be deposited.

Figure 5F:
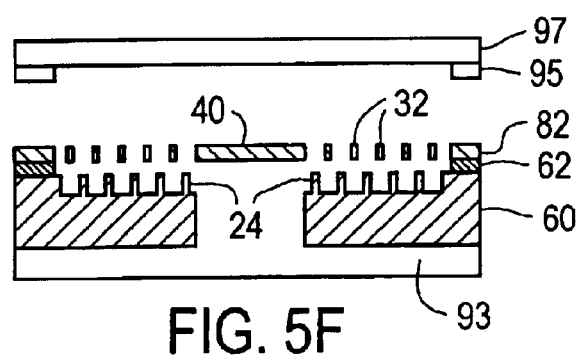

As shown in FIG. 5F, a bottom transparent plate 93 may be attached to the bottom wafer 60 and a top transparent plate 97 with a spacer 95 may be attached to the silicon wafer 82. The transparent plates may be glass or quartz. Thus, during operation, light passes through a transparent plate, hits the mirror, and reflects back through the transparent plate.

The fabrication of the device has now been described. Attention now turns to the performance achieved by a device formed in accordance with an embodiment of the invention. The performance of the device will be discussed in the context of optical resolution. The optical resolution—defined as the ratio of the optical-beam divergence and the mirror scan angle—is an essential performance metric for a scanning mirror. For a perfectly flat mirror under uniform illumination, the farfield intensity distribution is an Airy pattern, which has a full-width-half-max half-angle beam divergence α (the resolution criteria used for video displays) given by $$\alpha = \frac{1.03\lambda}{D} \quad [1]$$

where $\lambda$ is the wavelength of the incident light and D is the mirror diameter. The resulting optical resolution N is $$N = \frac{4\theta D}{\alpha} = \frac{4\theta D}{1.03\lambda} \quad [2]$$

where θ is the mechanical half-angle mirror scan (the total optical scan is 4 θ).

Dynamic mirror deformation can also contribute to beam divergence, thereby decreasing the optical resolution. For a mirror where the torsion hinge is the dominant compliance, the nonplanar surface deformation δ of a rectangular scanning mirror of half-length L with angular acceleration $(2\pi f)^2 \theta$ (where f is the scan frequency) is $$\delta = 0.183 \frac{\rho(1-v^2)(2\pi f)^2 \theta}{Et^2} L^5 \quad [3]$$

where ρ is the material density, v is Poisson's ratio, E is Young's modulus, and t is the mirror thickness.

The Rayleigh limit, the maximum amount of surface deformation tolerable without significant degradation in image quality, allows a peak-to-valley surface deformation of λ/4. For a 550 μm-long (275 μm-half-length) rectangular single-crystal-silicon mirror of thickness 50 μm, half-angle mechanical scan 6.25°, and resonant frequency 34 kHz, the calculated dynamic deformation is 8 nm—much lower than the Rayleigh limit for 655 nm light (164 nm). For comparison, a 550 μm-long surface-micromachined mirror of thickness 1.5 μm maintains the surface flatness within the Rayleigh limit only up to a frequency of 4.6 kHz.

The STEC mirror excels in all critical performance criteria: cost, resolution, scan speed, scan repeatability, size, power consumption, and reliability. The following text discusses measurements of four of these performance criteria for one STEC mirror design.

The surface deformation of the micromirror was characterized using a stroboscopic interferometer. The total deformation measured was less than 30 nm, considerably below the Rayleigh limit, and does not significantly reduce the optical resolution. Characterization tests also demonstrate that the spot size and separation at eight different regions across the scan give a measured total optical resolution of 350 pixels. The resolution of a 550 μm-diameter mirror with 24.9° optical scan and 655 nm laser light was near the diffraction-limited resolution of 355 pixels from Eq. [2].

The scan speed of the device of the invention is better than the scan speeds achieved in the prior art. STEC micromirrors have been demonstrated with diameters of 550 μm and resonant frequencies up to 42 kHz—almost an order of magnitude faster than commercially available optical scanners. Larger STEC mirrors have also been fabricated (up to 2 mm) with lower resonant frequencies.

The main limitation of macro-scale scanners comes from the dynamic deformation described by Eq.[3]—the dynamic deformation scales as the fifth power of the mirror length, so large mirrors scanning at high speeds will have considerable dynamic deformation. For example, a 10 mm-diameter, 1 mm-thick mirror with a mechanical scan of ±6.25° maintains less than 164 nm dynamic deformation (the Rayleigh limit for 655 nm light) up to a frequency of only 2.2 kHz. Large-scale mirrors cannot achieve the speeds demonstrated with the STEC micromirrors without severe dynamic deformation or very thick mirrors.

High-speed scanners require more torque than low-speed scanners to reach the same scan angle. In order to generate the torque necessary for large angle, high-frequency operation of the STEC micromirror, relatively high voltages are used. The 550 μm-diameter mirror with a resonant frequency of 34 kHz requires a 171 Vrms input sine wave for a total optical scan of 24.90°. To simplify mirror testing and operation, a small (1 cm³) 25:1 transformer is used, allowing the use of a conventional 0–10 V function generator to drive the scanning mirrors with a sinusoidal waveform of amplitude up to 250 V. The use of the transformer also provides efficient power conversion, so the power consumption of the entire system can be much lower than systems requiring high-voltage power supplies and opamps.

This power consumption is the sum of the power dissipation in the drive electronics and the power dissipated by air and material damping. The power consumption due to damping is $$P = \frac{1}{2}b\theta^2\omega^2 = \frac{1}{2}\frac{k}{Q}\theta^2\omega \quad [4]$$

where k is the torsional spring stiffness, b is the torque damping factor, θ is the mechanical scan half angle (the total optical scan is ±2θ₀), ω is the resonant frequency, and Q is the resonant quality factor. For the 34 kHz 550 μm-diameter mirror scanning 25° optical (±6.25° mechanical), the calculated stiffness k=3.93×10⁻⁵ Nm/radian, the measured resonant quality factor Q=273, so the power consumption due to damping from Eq. [4] is 0.18 mW. Vacuum packaging can be used to reduce the viscous damping, and thereby decrease the power consumption.

The measured power consumption is 6.8 mW, indicating that the majority of the power consumption is in charging and discharging the parasitic capacitance and losses in the transformer power conversion.

The STEC micromirror is extremely reliable due to its simple structure. It is predicted that the failure point for the structure will be the torsion hinges (at the point of highest strain). The maximum strain in a 50 µm-thick, 15 µm-wide, 150 µm-long hinge (the hinge used for the 550 µm-diameter mirror with resonant frequency of 34 kHz) with a total scan of ±6.25° is approximately 1.8%. Mirrors have been operated at this level for over 200 million cycles without any noticeable degradation in performance. Wider and longer hinges may be used to reduce strain while retaining the same stiffness.

The invention has been fully described. Attention now turns to variations of the disclosed technology. Individual STEC micromirrors of the invention can be combined to form two-dimensional scanners. Advantageously, the capacitance of the combteeth may be used as an integrated mirror-position feedback sensor. An independent comb can be added to the frontside mask to allow capacitive measurement of the mirror position independent of the drive voltage. An independent comb can be added to the frontside mask to allow frequency tuning of the micromirror resonance. A separate combdrive can be added to the mirror to allow bidirectional scanning. These embodiments are shown in connection with FIGS. 6–8.

Figure 6:
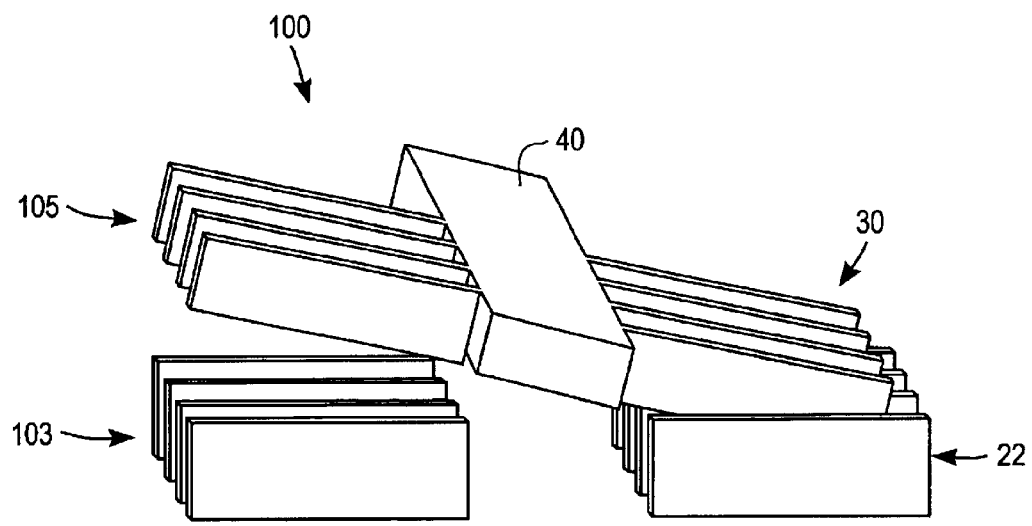
FIG. 6 illustrates an embodiment of the invention with dual mounted moving combteeth and an additional stationary combteeth assembly.

FIG. 6 illustrates an embodiment of the invention with a dual-mounted moving combteeth assembly 100. The figure illustrates the previously discussed components of a stationary combteeth assembly 22, a moving combteeth assembly 30, and a mirror or paddle 40. In accordance with this embodiment of the invention, the moving combteeth assembly 30 includes an additional set of combteeth 105. The additional set of combteeth 105 may be attached to the mirror 40, as shown in FIG. 6. Alternately, the combteeth 105 may be positioned on the same spine supporting the moving combteeth assembly 30. In other words, in this alternate embodiment, a single spine 34 of the type shown in FIGS. 1–3 has combteeth extending from both sides of the spine. FIG. 6 further illustrates an additional stationary combteeth assembly 103. Applying a voltage between the additional set of combteeth 105 and the additional stationary combteeth assembly 103 causes the mirror 40 to tilt towards the additional stationary combteeth assembly 103.

Figure 7:
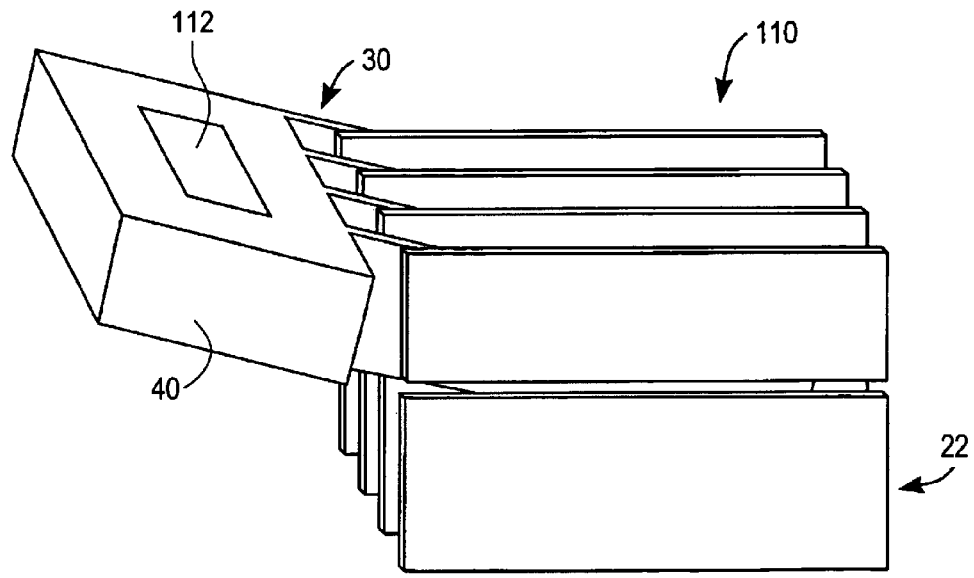
FIG. 7 illustrates an embodiment of the invention with stacked stationary combteeth assemblies.

FIG. 7 illustrates an alternate embodiment of the invention which includes a stacked combteeth assembly 110. The figure illustrates the previously discussed components of a stationary combteeth assembly 22, a moving combteeth assembly 30, and a mirror or paddle 40. Positioned over the stationary combteeth assembly 22 is a stacked combteeth assembly 110. Preferably, the stacked combteeth assembly 110 is electrically isolated from the moving combteeth assembly 30 and the stationary combteeth assembly 22. This configuration allows for simplified capacitive sensing by the stacked combteeth assembly 110. The stacked combteeth assembly 110 may also be independently controlled for resonant frequency tuning.

FIG. 7 also illustrates a mounted electronic component 112 positioned on the paddle 40. By way of example, the mounted electronic component 112 may be an ultrasonic transducer or an ultrasonic sensor.

Figure 8:
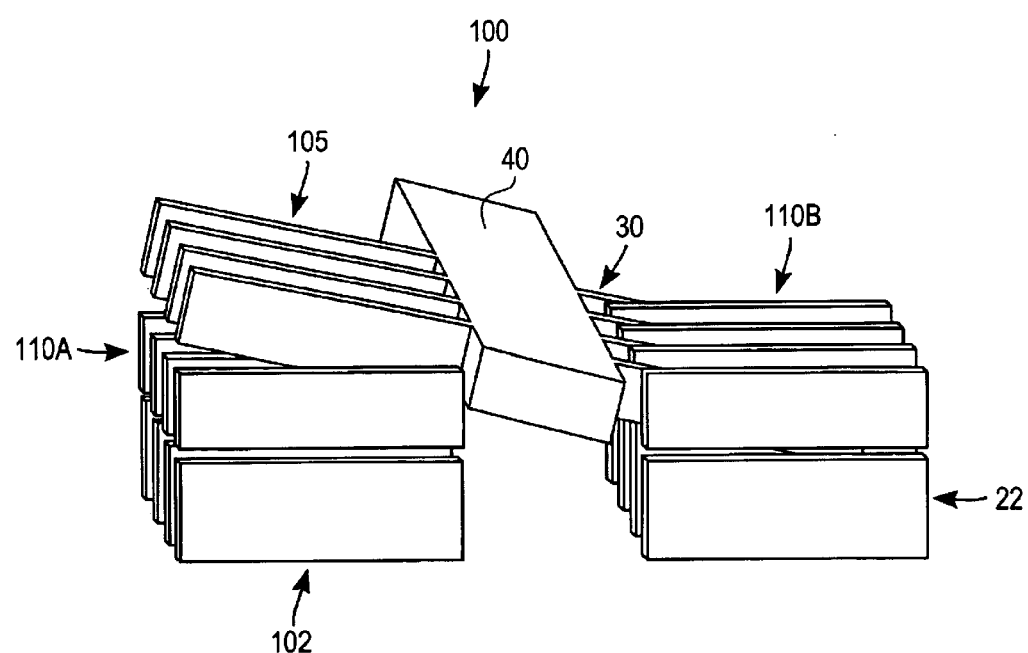
FIG. 8 illustrates an embodiment of the invention with dual mounted moving combteeth and stacked stationary combteeth assemblies.

FIG. 8 illustrates another embodiment of the invention in which the features of FIGS. 6 and 7 are combined into a single device. In particular, the figure shows the dual-mounted moving combteeth assembly 100 operative in connection with a set of stacked combteeth assemblies 110A and 110B.

The foregoing description, for purposes of explanation used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A torsional electrostatic combdrive, comprising:
   a stationary combteeth assembly having first combteeth; and
   a movable combteeth assembly, including a mirror and one or more elongated combteeth spines coupled to and extending away from sides of the mirror, the one or more combteeth spines each having second combteeth extending therefrom for engaging the first combteeth;
   wherein the movable combteeth assembly is positioned entirely above the stationary combteeth assembly by a predetermined vertical displacement during a combdrive resting state.

2. The torsional electrostatic combdrive of claim 1, wherein:
   each combteeth spine includes a major axis extending directly away from a central portion of a respective side of the mirror.

3. The torsional electrostatic combdrive of claim 1 wherein the predetermined vertical displacement is between 0.2 and 3.0 microns.

4. The torsional electrostatic combdrive of claim 1 wherein the mirror is formed of single-crystal silicon.

5. The torsional electrostatic combdrive of claim 4 wherein the second combteeth are positioned between the first combteeth of the stationary combteeth assembly during a combdrive activation state, and the mirror intersects a plane defined by the first combteeth during the combdrive activation state.

6. The torsional electrostatic combdrive of claim 5 wherein the mirror pivots about a torsional hinge during the combdrive activation state.

7. The torsional electrostatic combdrive of claim 1 wherein the movable combteeth assembly further includes an anchor, a torsional hinge being positioned between the mirror and the anchor.

8. The torsional electrostatic combdrive of claim 1 wherein the movable combteeth assembly has a thickness of between 10 and 500 microns.

9. The torsional electrostatic combdrive of claim 8 wherein the movable combteeth assembly has a thickness of between 50 and 100 microns.

10. The torsional electrostatic combdrive of claim 1 wherein the mirror has a lateral length of less than 10 millimeters.

11. The torsional electrostatic combdrive of claim 1 wherein the mirror has a lateral length of between 550 and 2000 microns.

12. The torsional electrostatic combdrive of claim 1 wherein the position of the movable combteeth assembly is adjusted in response to a capacitance value measured between the movable combteeth assembly and the stationary combteeth assembly.

13. The torsional electrostatic combdrive of claim 1 further comprising transparent substrates enclosing the stationary combteeth assembly and the movable combteeth assembly.

14. The torsional electrostatic combdrive of claim 1 wherein the mirror includes a multilayer optical filter.

15. The torsional electrostatic combdrive of claim 1 wherein the one or more combteeth spines define a plane that is perpendicular to and intersecting the surface of the mirror.

16. The torsional electrostatic combdrive of claim 15 wherein the second combteeth are positioned on a first side of the plane.

17. The torsional electrostatic combdrive of claim 16 the movable combteeth assembly further comprising:
   a torsional hinge about which the mirror pivots during a combdrive activation state; and
   one or more anchors coupled to the torsional hinge, wherein the one or more anchors are positioned on a second side of the plane.

18. The torsional electrostatic combdrive of claim 1 wherein the second combteeth extend perpendicularly away from the combteeth spines.

19. The torsional electrostatic combdrive of claim 1, wherein the torsional electrostatic combdrive is configured to maintain the mirror at a static position.

20. A torsional electrostatic combdrive, comprising:
   a stationary combteeth assembly having first combteeth; and
   a movable combteeth assembly, including a mirror and a pair of combteeth spines coupled to and extending in opposite directions away from sides of the mirror, the combteeth spines each having second combteeth extending therefrom for engaging the first combteeth;
   wherein the movable combteeth assembly is positioned entirely above the stationary combteeth assembly by a predetermined vertical displacement during a combdrive resting state.

21. The torsional electrostatic combdrive of claim 20, wherein: each combteeth spine includes a major axis extending in opposite directions directly away from a central portion of a respective sides of the mirror.

22. The torsional electrostatic combdrive of claim 20, wherein the combteeth spines are elongated structures and the second combteeth extend perpendicularly away from the combteeth spines.

23. The torsional electrostatic combdrive of claim 20, wherein the first combteeth extending from a first combteeth spine of the pair of combteeth spines and the second combteeth extending from a second combteeth spine of the pair of combteeth spines extend from the combteeth spines in a same direction.

24. The torsional electrostatic combdrive of claim 20, wherein the torsional electrostatic combdrive is configured to maintain the mirror at a static position.

25. The torsional electrostatic combdrive of claim 20 wherein the predetermined vertical displacement is between 0.2 and 3.0 microns.

26. The torsional electrostatic combdrive of claim 20 wherein the mirror is formed of single-crystal silicon.

27. The torsional electrostatic combdrive of claim 20 wherein the first second combteeth are positioned between the first combteeth of the stationary combteeth assembly during a combdrive activation state, and the mirror intersects a plane defined by the first combteeth during the combdrive activation state.

28. The torsional electrostatic combdrive of claim 20 wherein the mirror pivots about a torsional hinge during the combdrive activation state.

29. The torsional electrostatic combdrive of claim 20 wherein the movable combteeth assembly further includes an anchor, a torsional hinge being positioned between the mirror and the anchor.

30. The torsional electrostatic combdrive of claim 20 wherein the movable combteeth assembly has a thickness of between 10 and 500 microns.

31. The torsional electrostatic combdrive of claim 20 wherein the movable combteeth assembly has a thickness of between 50 and 100 microns.

32. The torsional electrostatic combdrive of claim 20 wherein the mirror has a lateral length of less than 10 millimeters.

33. The torsional electrostatic combdrive of claim 20 wherein the mirror has a lateral length of between 550 and 2000 microns.

34. The torsional electrostatic combdrive of claim 20 wherein the position of the movable combteeth assembly is adjusted in response to a capacitance value measured between the movable combteeth assembly and the stationary combteeth assembly.

35. The torsional electrostatic combdrive of claim 20 further comprising transparent substrates enclosing the stationary combteeth assembly and the movable combteeth assembly.

36. The torsional electrostatic combdrive of claim 20 wherein the mirror includes a multilayer optical filter.

37. The torsional electrostatic combdrive of claim 20, wherein the one or more combteeth spines define a plane that is perpendicular to and intersecting the surface of the mirror.

38. The torsional electrostatic combdrive of claim 37, wherein the second combteeth are positioned on a first side of the plane.

39. The torsional electrostatic combdrive of claim 38, the movable combteeth assembly further comprising:
   a torsional hinge about which the mirror pivots during a combdrive activation state; and
   one or more anchors coupled to the torsional hinge, wherein the one or more anchors are positioned on a second side of the plane.

* * * * *